US011610798B2

(12) United States Patent
Kuno et al.

(10) Patent No.: US 11,610,798 B2
(45) Date of Patent: Mar. 21, 2023

(54) ELECTROSTATIC CHUCK ASSEMBLY, ELECTROSTATIC CHUCK, AND FOCUS RING

(71) Applicant: NGK INSULATORS, LTD., Nagoya (JP)

(72) Inventors: Tatsuya Kuno, Nagoya (JP); Ikuhisa Morioka, Handa (JP); Kenichiro Aikawa, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 257 days.

(21) Appl. No.: 16/856,224

(22) Filed: Apr. 23, 2020

(65) Prior Publication Data
US 2020/0251371 A1    Aug. 6, 2020

Related U.S. Application Data

(63) Continuation of application No. PCT/JP2018/040590, filed on Oct. 31, 2018.
(Continued)

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32642* (2013.01); *H01J 37/32724* (2013.01); *H01L 21/67126* (2013.01); *H01J 2237/002* (2013.01)

(58) Field of Classification Search
CPC ........... H01L 21/6833; H01L 21/67126; H01L 21/67103; H01L 21/67109; H01L 21/6831;
(Continued)

(56) References Cited

U.S. PATENT DOCUMENTS 5,958,265 A   9/1999  Ogahara
6,475,336 B1  11/2002 Hubacek
(Continued)

FOREIGN PATENT DOCUMENTS

CN   1540738 A     10/2004
JP   H10-303288 A  11/1998
(Continued)

OTHER PUBLICATIONS

Korean Office Action (Application No. 10-2020-7012239) dated Sep. 10, 2021 (with English translation).
(Continued)

*Primary Examiner* — Renan Luque
(74) *Attorney, Agent, or Firm* — Burr Patent Law, PLLC (57) ABSTRACT

An electrostatic chuck assembly includes a ceramic body having a wafer placement surface that is a circular surface, and an F/R placement surface that is formed around the wafer placement surface and is positioned at a lower level than the wafer placement surface, a wafer attraction electrode embedded inside the ceramic body and positioned in a facing relation to the wafer placement surface, an F/R attraction electrode embedded inside the ceramic body and positioned in a facing relation to the F/R placement surface, a concave-convex region formed in the F/R placement surface to hold gas, a focus ring placed on the F/R placement surface, and a pair of elastic annular sealing members arranged between the F/R placement surface and the focus ring on the inner peripheral side and the outer peripheral side of the F/R placement surface, and surrounding the concave-convex region in a sandwiching relation.

3 Claims, 4 Drawing Sheets

Related U.S. Application Data (60) Provisional application No. 62/581,900, filed on Nov. 6, 2017.

(58) Field of Classification Search
CPC ........... H01L 21/68735; H01L 21/6875; H01L 21/68757; H01L 21/68785; H01J 37/32642; H01J 37/32724; H01J 2237/002; H02N 13/00; B23Q 3/15
See application file for complete search history.

(56) References Cited

U.S. PATENT DOCUMENTS

| | | |
|---|---|---|
| 2003/0106647 A1 | 6/2003 | Koshiishi et al. |
| 2004/0261946 A1* | 12/2004 | Endoh ................. H01L 21/6831 156/345.1 |
| 2006/0254717 A1 | 11/2006 | Kobayashi et al. |
| 2009/0044751 A1* | 2/2009 | Park .................. H01L 21/68735 118/723 R |
| 2010/0040768 A1* | 2/2010 | Dhindsa ............ H01J 37/32724 427/248.1 |
| 2012/0160808 A1 | 6/2012 | Kikuchi et al. |
| 2013/0048217 A1 | 2/2013 | Shiraiwa |
| 2015/0053348 A1* | 2/2015 | Nagayama .......... H01J 37/3266 118/723 R |
| 2017/0207110 A1 | 7/2017 | Satoh et al. |
| 2018/0277418 A1* | 9/2018 | Sato ........................ H01L 21/68 |
| 2018/0350568 A1* | 12/2018 | Mitsumori ........ H01J 37/32027 |

FOREIGN PATENT DOCUMENTS

| | | |
|---|---|---|
| JP | 2004-511901 A | 4/2004 |
| JP | 2004-179364 A | 6/2004 |
| JP | 2005-064460 A1 | 3/2005 |
| JP | 2006-319043 A | 11/2006 |
| JP | 2008-288611 A | 11/2008 |
| JP | 2010-183074 A1 | 8/2010 |
| JP | 4559595 B2 | 10/2010 |
| JP | 2012-500470 A1 | 1/2012 |
| JP | 2013-045989 A | 3/2013 |
| JP | 2015-041451 A1 | 3/2015 |
| JP | 2017-126727 A1 | 7/2017 |
| KR | 10-2012-0071362 A | 7/2012 |

OTHER PUBLICATIONS

International Search Report and Written Opinion (Application No. PCT/JP2018/040590) dated Jan. 15, 2019.

English translation of the International Preliminary Report on Patentability (Chapter I) (Application No. PCT/JP2018/040590) dated May 22, 2020.

Chinese Office Action dated Feb. 8, 2023 (Application No. 201880067044.2).

\* cited by examiner

ELECTROSTATIC CHUCK ASSEMBLY, ELECTROSTATIC CHUCK, AND FOCUS RING

The present application claims priority from U.S. provisional Patent Application No. 62/581,900 filed on Nov. 6, 2017, the entire contents of which are incorporated herein by reference.

BACKGROUND OF THE INVENTION

1. Field of the Invention

The present invention relates to an electrostatic chuck assembly, an electrostatic chuck, and a focus ring.

2. Description of the Related Art

Plasma processing apparatuses, such as a plasma etching apparatus, a plasma CVD apparatus, and a plasma ashing apparatus, are known up to now. In those plasma processing apparatuses, a wafer placement device on which a wafer is to be placed is usually installed within a vacuum chamber. The wafer placement device includes an electrostatic chuck for attracting and fixing, to a wafer placement surface, the wafer on which plasma processing is to be performed, and a cooling plate for cooling the electrostatic chuck. The electrostatic chuck is constituted, for example, by embedding an inner electrode in an insulator or a dielectric (ceramic in many cases). In that type of wafer placement device, the wafer is attracted and fixed to the wafer placement surface by applying a DC voltage to the inner electrode in a state in which the wafer is placed on the wafer placement surface, and generating electrostatic force (Coulomb force or Johnson-Rahbeck force). In the above state, plasma is produced to come into contact with the wafer. A replaceable focus ring is often disposed around the wafer placement surface. The focus ring is placed on a focus ring placement surface that is positioned at a lower level than the wafer placement surface. The focus ring has the role of stably producing the plasma up to an outer peripheral edge of the wafer, and the role of protecting a surface of the electrostatic chuck. When the plasma processing is performed on the wafer, temperatures of the wafer and the focus ring rise because not only the wafer but also the focus ring is exposed to the plasma. The wafer attracted and fixed to the electrostatic chuck is cooled by the cooling plate through the electrostatic chuck. However, because the focus ring is substantially thicker than the electrostatic chuck, the focus ring is not sufficiently attracted to the electrostatic chuck and the temperature of the focus ring rises excessively in some cases. This may cause a possibility that the temperature at the outer peripheral edge of the wafer becomes too high and the yield of a plasma processing process reduces.

In consideration of the above point, Patent Literature (PTL) 1 proposes an electrostatic chuck made of alumite-treated aluminum in which a dielectric used to form a wafer placement surface and a dielectric used to form a focus ring placement surface are selected to be different in specific resistivity from each other such that a wafer is attracted by the Coulomb force and the focus ring is attracted by the Johnson-Rahbeck force. Furthermore, PTL 2 proposes a technique of disposing a focus ring attraction electrode inside a single ceramic separately from a wafer attraction electrode, changing only a chucking voltage, which is applied to the focus ring attraction electrode, depending on individual steps of plasma processing, and increasing the chucking voltage to increase the attraction force in an etching step in which temperature of the focus ring tends to become high.

CITATION LIST

Patent Literature

PTL 1: Japanese Patent No. 4559595
PTL 2: Japanese Unexamined Patent Application Publication No. 2010-183074

SUMMARY OF THE INVENTION

PTLs 1 and 2 disclose that helium gas is supplied to between the focus ring placement surface and the focus ring in order to smooth heat transfer between the focus ring placement surface and the focus ring. However, PTLs 1 and 2 have the problem that the helium gas supplied to between the focus ring placement surface and the focus ring leaks to the surroundings without staying between the focus ring placement surface and the focus ring, and the heat transfer cannot be sufficiently performed with the helium gas in some cases. Thus, it has been demanded to suppress such a gas leakage.

The present invention has been made with intent to solve the above-described problem, and a main object of the present invention is to provide an electrostatic chuck assembly, an electrostatic chuck, and a focus ring with which gas supplied to between a focus ring placement surface and a focus ring can be suppressed from leaking to the surroundings.

An electrostatic chuck assembly of the present invention includes:

a ceramic body having a wafer placement surface that is a circular surface, and a focus ring placement surface that is formed around the wafer placement surface and is positioned at a lower level than the wafer placement surface;

a first electrode embedded inside the ceramic body and positioned in a facing relation to the wafer placement surface;

a second electrode embedded inside the ceramic body and positioned in a facing relation to the focus ring placement surface;

a concave-convex region formed in the focus ring placement surface to hold gas;

a focus ring placed on the focus ring placement surface; and a pair of elastic annular sealing members arranged between the focus ring placement surface and the focus ring on inner peripheral side and outer peripheral side of the focus ring placement surface, and surrounding the concave-convex region in a sandwiching relation.

In use of the electrostatic chuck assembly described above, voltages are applied to the first electrode and the second electrode in a state in which a wafer is placed on the wafer placement surface. With the application of the voltages, the wafer is attracted to the wafer placement surface and the focus ring is attracted to the focus ring placement surface. Attraction force for attracting the focus ring to the focus ring placement surface may be the Coulomb force or the Johnson-Rahbeck force, but the Johnson-Rahbeck force is more preferable. Because the focus ring is thicker than the wafer, it is hard to tightly attract the focus ring while correcting a warp of the focus ring. However, the elastic annular sealing members absorb the warp of the focus ring, and hence the focus ring can be tightly attracted to the focus ring placement surface. As a result, the concave-convex region of the focus ring placement surface is kept in an airtight or almost airtight state by the elastic annular sealing members and the focus ring, whereby a leakage of gas supplied to the concave-convex region can be suppressed. Moreover, since the first electrode and the second electrode are independent of each other, appropriate voltages can be applied to the individual electrodes.

In the electrostatic chuck assembly according to the present invention, the elastic annular sealing members may be fitted into annular grooves formed in at least one of the focus ring placement surface and the focus ring. With that feature, the elastic annular sealing members can be easily set in place with the aid of the annular grooves. Instead of fitting the elastic annular sealing members into the annular grooves, they may be sandwiched between a flat portion of the focus ring placement surface and a flat portion of the focus ring. In such a case, the elastic annular sealing members may be bonded to at least one of the focus ring placement surface and the focus ring by an adhesive.

An electrostatic chuck of the present invention includes:

a ceramic body having a wafer placement surface that is a circular surface, and a focus ring placement surface that is formed around the wafer placement surface and is positioned at a lower level than the wafer placement surface;

a first electrode embedded inside the ceramic body and positioned in a facing relation to the wafer placement surface;

a second electrode embedded inside the ceramic body and positioned in a facing relation to the focus ring placement surface;

a concave-convex region formed in the focus ring placement surface to hold gas; and a pair of annular grooves formed on inner peripheral side and outer peripheral side of the focus ring placement surface, and surrounding the concave-convex region in a sandwiching relation.

In use of the electrostatic chuck described above, after placing a wafer on the wafer placement surface and fitting the elastic annular sealing members into the pair of annular grooves in the focus ring placement surface, the focus ring is placed on the focus ring placement surface. In that state, voltages are applied to the first electrode and the second electrode. With the application of the voltages, the wafer is attracted to the wafer placement surface and the focus ring is attracted to the focus ring placement surface. Attraction force for attracting the focus ring to the focus ring placement surface may be the Coulomb force or the Johnson-Rahbeck force, but the Johnson-Rahbeck force is more preferable. Because the focus ring is thicker than the wafer, it is hard to tightly attract the focus ring while correcting a warp of the focus ring. However, the elastic annular sealing members fitted into the pair of annular grooves in the focus ring placement surface absorb the warp of the focus ring, and hence the focus ring can be tightly attracted to the focus ring placement surface. As a result, the concave-convex region of the focus ring placement surface is kept in an airtight or almost airtight state by the elastic annular sealing members fitted into the pair of annular grooves and the focus ring, whereby a leakage of gas supplied to the concave-convex region can be suppressed. Moreover, since the first electrode and the second electrode are independent of each other, appropriate voltages can be applied to the individual electrodes.

In the electrostatic chuck assembly or the electrostatic chuck according to the present invention, a main body of the ceramic body except for a portion between the focus ring placement surface and the second electrode may be formed of a first ceramic member with volume resistivity at a level capable of generating the Coulomb force, and a sub-body of the ceramic body constituted by the portion between the focus ring placement surface and the second electrode may be formed of a second ceramic member with volume resistivity at a level capable of generating the Johnson-Rahbeck force. With those features, in use of the electrostatic chuck, the wafer is attracted to the wafer placement surface by the Coulomb force, and the focus ring is attracted to the focus ring placement surface by the Johnson-Rahbeck force that is stronger than the Coulomb force. Because the Johnson-Rahbeck force provides stronger attraction force, the focus ring can be attracted to the focus ring placement surface while the warp of the focus ring is corrected.

In the electrostatic chuck assembly or the electrostatic chuck according to the present invention, preferably, the volume resistivity of the first ceramic member is not less than $1\times10^{15}$ $\Omega$cm at an operating temperature, and the volume resistivity of the second ceramic member is not less than $1\times10^{5}$ $\Omega$cm and not more than $1\times10^{13}$ $\Omega$cm at the operating temperature. With those features, the first ceramic member is easier to generate the Coulomb force, and the second ceramic member is easier to generate the Johnson-Rahbeck force. The operating temperature is a temperature when plasma processing is performed on the wafer, and is set as appropriate in a range from −100° C. to 150° C., for example. Generally, the operating temperature is set in a range from room temperature to 150° C. The volume resistivity of the second ceramic member may be not less than $1\times10^{8}$ $\Omega$cm and not more than $1\times10^{11}$ $\Omega$cm at the operating temperature.

In the electrostatic chuck assembly or the electrostatic chuck according to the present invention, preferably, the second ceramic member is made of a ceramic doped with a fourth group element of the periodic table. Such a ceramic is suitable for thermal spraying. The fourth group element of the periodic table is, for example, titanium, zirconium, or hafnium. A doping amount of the fourth group element of the periodic table may be set as appropriate in such a range that the volume resistivity of the second ceramic member is not less than $1\times10^{8}$ $\Omega$cm and not more than $1\times10^{13}$ $\Omega$cm at the operating temperature. The second ceramic member doped with the fourth group element of the periodic table is preferably made of the same main component as that of the first ceramic member. In that case, the thermal conductivity and the thermal expansion coefficient of the second ceramic member can be made substantially equal to those of the first ceramic member.

In the electrostatic chuck assembly or the electrostatic chuck according to the present invention, preferably, the second ceramic member has a thickness variation of not more than 0.5 mm. With this feature, since the second ceramic member does not include a too thin portion, dielectric breakdown is hard to occur. Moreover, since the second ceramic member does not include a too thick portion, a time necessary for eliminating charges is relatively shortened.

In the electrostatic chuck assembly or the electrostatic chuck according to the present invention, preferably, the second electrode is a bipolar electrode. With this feature, it is easier to perform, for example, a charge elimination process to prevent a problem that is often caused in an electrostatic chuck of Johnson-Rahbeck type, i.e., a trouble in detachment of the electrostatic chuck attributable to residual charges.

In the present invention, a focus ring is placed on a focus ring placement surface of an electrostatic chuck, the focus ring includes:

a pair of annular grooves formed in a surface of the focus ring on inner peripheral side and outer peripheral side, the surface being positioned on side placed on the electrostatic chuck, wherein the pair of annular grooves is formed at positions at which the annular grooves are able to surround inner peripheral side and outer peripheral side of a concave-convex region, which is formed in the focus ring placement surface to hold gas, in a sandwiching relation.

In use of the focus ring described above, after fitting the elastic annular sealing members into the pair of annular grooves in the focus ring, the focus ring is placed on the focus ring placement surface of the electrostatic chuck. In that state, the focus ring is attracted to the focus ring placement surface by electrostatic force (such as the Coulomb force or the Johnson-Rahbeck force). Because the focus ring is thicker than the wafer, it is hard to tightly attract the focus ring while correcting a warp of the focus ring. However, the elastic annular sealing members fitted into the pair of annular grooves in the focus ring absorb the warp of the focus ring, and hence the focus ring can be tightly attracted to the focus ring placement surface. As a result, the concave-convex region of the focus ring placement surface is kept in an airtight or almost airtight state by the elastic annular sealing members fitted into the pair of annular grooves and the focus ring, whereby a leakage of gas supplied to the concave-convex region can be suppressed.

DETAILED DESCRIPTION OF THE INVENTION

Figure 1:
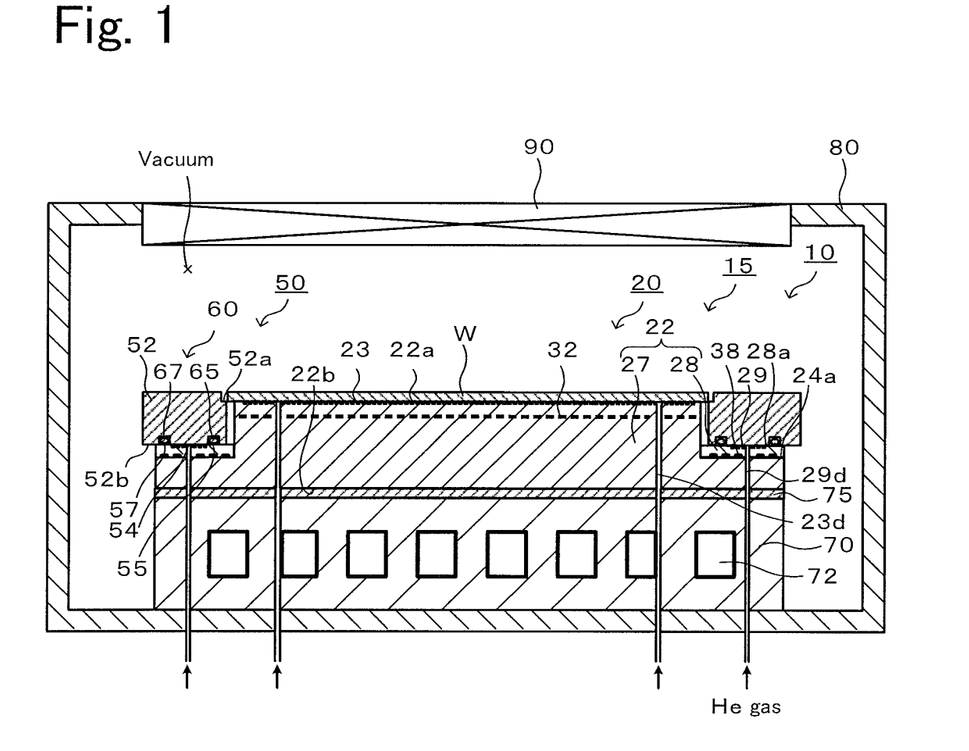
FIG. 1 is a vertical sectional view of a wafer placement device 10 disposed in a chamber 80.
Figure 2:
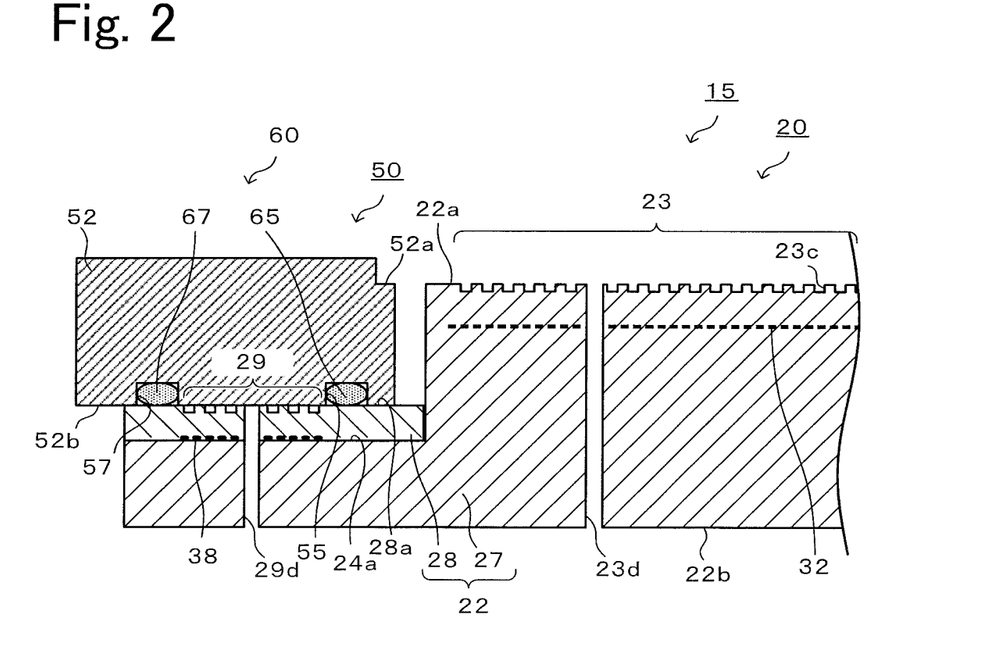
FIG. 2 is a partial enlarged view of an electrostatic chuck assembly 15 in FIG. 1.
Figure 3A:
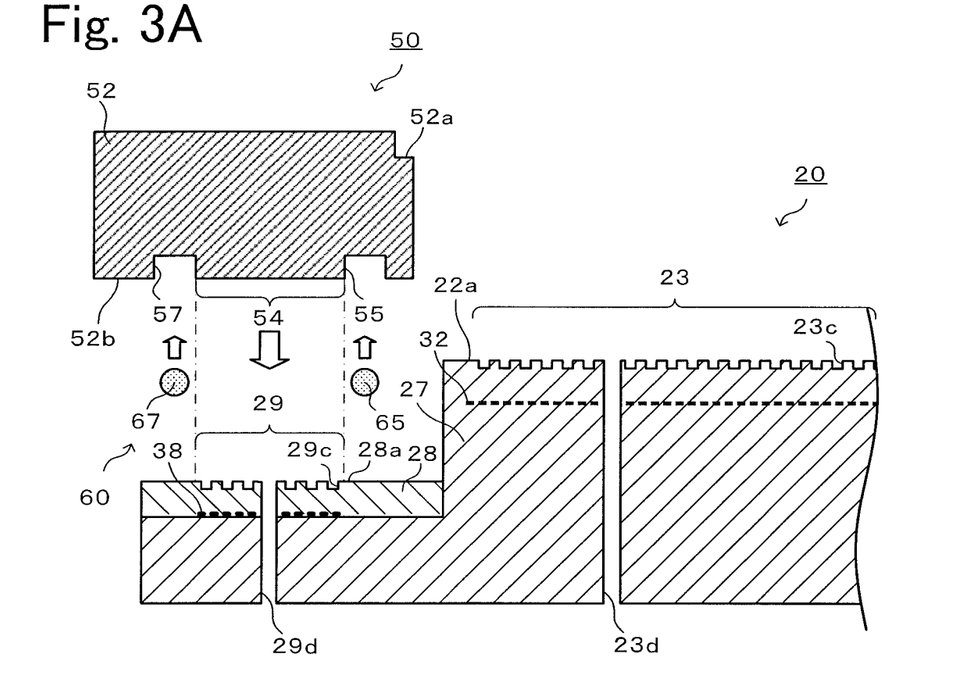
FIGS. 3A and 3B are explanatory views illustrating an assembly procedure of the electrostatic chuck assembly 15.
Figure 3B:
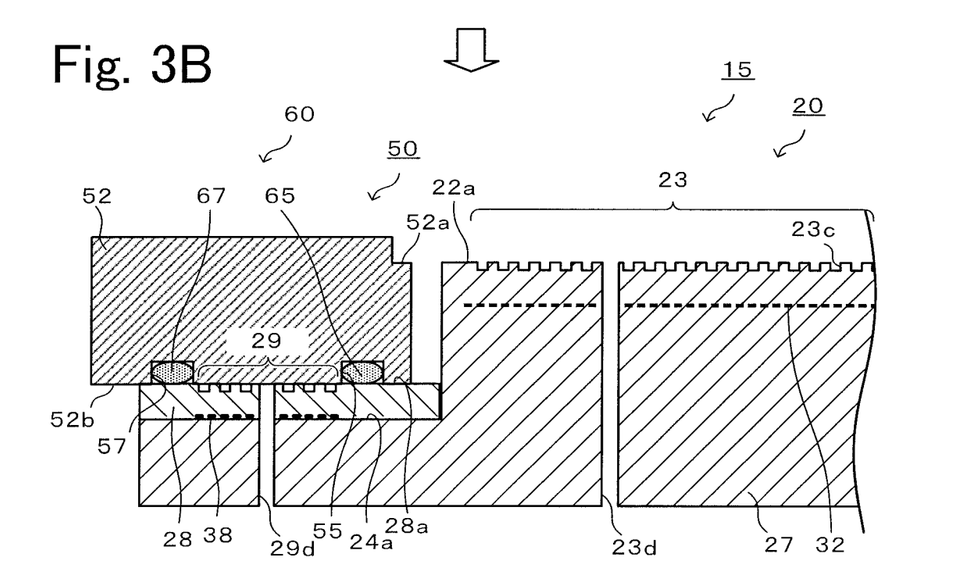

A preferred embodiment of the present invention will be described below with reference to the drawings. FIG. 1 is a vertical sectional view of a wafer placement device 10 disposed in a chamber 80, FIG. 2 is a partial enlarged view of an electrostatic chuck assembly 15 in FIG. 1, and FIGS. 3A and 3B are explanatory views illustrating an assembly procedure of the electrostatic chuck assembly 15.

The wafer placement device 10 is a device for performing etching, CVD, etc. on a wafer W by utilizing plasma, and is fixed to a bottom surface of the chamber 80 for a semiconductor process when used. The wafer placement device 10 includes the electrostatic chuck assembly 15 and a cooling plate 70. The electrostatic chuck assembly 15 includes an electrostatic chuck 20, a focus ring 50, and a pair of O-rings 60.

The electrostatic chuck 20 includes a ceramic body 22 having a disk-like shape. The ceramic body 22 has a circular wafer placement surface 22a on which the wafer W is to be placed, and an annular focus-ring (F/R) placement surface 28a that is formed around the wafer placement surface 22a and is positioned at a level lower than the wafer placement surface 22a by one step. A wafer attraction electrode 32 is embedded inside the ceramic body 22 and positioned in a facing relation to the wafer placement surface 22a. The wafer placement surface 22a is formed to have a smaller diameter than the wafer W. In a state in which the wafer W is placed on the wafer placement surface 22a, therefore, an outer peripheral edge of the wafer W protrudes outward from the wafer placement surface 22a. Moreover, a focus ring (F/R) attraction electrode 38 is disposed independently of the wafer attraction electrode 32 inside the ceramic body 22 and positioned in a facing relation to the F/R placement surface 28a. The ceramic body 22 is bonded at a rear surface 22b on the opposite side to the wafer placement surface 22a to the cooling plate 70 with a bonding sheet 75 interposed therebetween.

The ceramic body 22 includes a first ceramic member 27 and a second ceramic member 28. The second ceramic member 28 is an annular portion of the ceramic body 22, the annular portion being positioned above a lower surface of the F/R attraction electrode 38, and the first ceramic member 27 is a portion of the ceramic body 22 other than the second ceramic member 28. The first ceramic member 27 has volume resistivity at a level capable of generating the Coulomb force and is made of a ceramic material such as aluminum nitride, silicon nitride, or aluminum oxide. The first ceramic member 27 can sufficiently generate the Coulomb force when the volume resistivity is not less than $1 \times 10^{15}$ Ωcm at an operating temperature (e.g., a temperature in a range from ordinary temperature to 150° C., this is similarly applied to the following description). The second ceramic member 28 has volume resistivity at a level capable of generating the Johnson-Rahbeck force and is made of a material obtained by doping a fourth group element (e.g., titanium) of the periodic table into the ceramic material of the first ceramic member 27. The second ceramic member 28 can sufficiently generate the Johnson-Rahbeck force when the volume resistivity is not less than $1 \times 10^{8}$ Ωcm and not more than $1 \times 10^{13}$ Ωcm (preferably not less than $1 \times 10^{8}$ Ωcm and not more than $1 \times 10^{11}$ Ωcm) at the operating temperature. The second ceramic member 28 is formed to have a thickness of 0.05 mm to 2 mm and a thickness variation of not more than 0.5 mm. The second ceramic member 28 is a sprayed film in this embodiment.

A concave-convex region 23 for holding gas is formed in the wafer placement surface 22a of the ceramic body 22. The concave-convex region 23 is formed over the entirety of the wafer placement surface 22a. A plurality of concavities and convexities are formed in the concave-convex region 23 by embossing. Heat transfer gas (e.g., He gas) is supplied to between the concavities 23c formed in the concave-convex region 23 and the wafer W placed on the wafer placement surface 22a from a gas supply path 23d penetrating through the ceramic body 22 from the rear surface 22b to the wafer placement surface 22a. A concave-convex region 29 for holding gas is formed in the F/R placement surface 28a of the ceramic body 22. The concave-convex region 29 is an annular region coaxial with the F/R placement surface 28a, and a plurality of concavities and convexities are formed in the concave-convex region 29 by embossing. Heat transfer gas (e.g., He gas) is supplied to between the concavities 29c formed in the concave-convex region 29 and the focus ring 50 placed on the F/R placement surface 28a from a gas supply path 29d. The gas supply path 29d is formed to penetrate through the ceramic body 22 from the rear surface 22b to the F/R placement surface 28a.

The wafer attraction electrode 32 is formed of a conductive mesh or plate and is disposed parallel (including a substantially parallel state, this is similarly applied to the following description) to the wafer placement surface 22a. A rear surface of the wafer attraction electrode 32 is connected to a not-illustrated power supply rod that is inserted into the ceramic body 22 from the rear surface 22b. A DC voltage is applied to the wafer attraction electrode 32 through the power supply rod.

The F/R attraction electrode 38 is a bipolar electrode formed of a conductive printed pattern, and a pair of comb-shaped electrodes is provided on an annular recessed step surface 24a in a spaced relation. A rear surface of the F/R attraction electrode 38 is connected to a not-illustrated power supply rod that is inserted into the ceramic body 22 from the rear surface 22b. A DC voltage is applied to the F/R attraction electrode 38 through the power supply rod.

The focus ring 50 is a member made of metal silicon, for example, and it includes a ring main body 52 placed on the F/R placement surface 28a of the electrostatic chuck 20. An annular recessed step surface 52a having an L-shaped cross-section is formed in an upper end portion of the ring main body 52 along its inner periphery. The annular recessed step surface 52a is formed to have an outer diameter slightly larger than diameters of the wafer W and the wafer placement surface 22a in order to avoid interference with the wafer W. The focus ring 50 having such a structure has the role of protecting the wafer W and the electrostatic chuck 20. The focus ring 50 is simply placed on the F/R placement surface 28a without being bonded to the F/R placement surface 28a. When the plasma process is plasma etching, a material of the focus ring 50 is selected as appropriate depending on the type of an etching target film in the wafer W. As illustrated in FIGS. 3A and 3B, a pair of annular grooves, i.e., an inner peripheral groove 55 and an outer peripheral groove 57, is formed in a rear surface 52b of the ring main body 52 (i.e., in a surface thereof on the side placed on the electrostatic chuck 20) on the inner peripheral side and the outer peripheral side of an opposing region 54 that is opposed to the concave-convex region 29 of the F/R placement surface 28a when the focus ring 50 is placed on the electrostatic chuck 20, the grooves 55 and 57 being positioned to surround the opposing region 54 in a sandwiching relation. The inner peripheral groove 55 and the outer peripheral groove 57 are each an annular groove that is coaxial with the ring main body 52 and has a U-shaped cross-section.

A pair of O-rings 60 includes a small-diameter O-ring 65 and a large-diameter O-ring 67. The O-rings 65 and 67 are O-rings made of fluorine rubber such as perfluoro ether. The small-diameter O-ring 65 is fitted into the inner peripheral groove 55 of the focus ring 50, and the large-diameter O-ring 67 is fitted into the outer peripheral groove 57 of the focus ring 50. Those O-rings 65 and 67 have the role of absorbing a warp of the focus ring 50, tightly attracting the focus ring 50 to the F/R placement surface 28a, and suppressing a leakage of gas supplied to the concave-convex region 29 of the F/R placement surface 28a.

The cooling plate 70 is a disk-shaped plate made of a metal represented by aluminum or an aluminum alloy, for example, and it includes therein a coolant path 72 through which a coolant can circulate. The coolant path 72 is connected to a coolant supply path and a coolant discharge path both penetrating through the chamber 80. The coolant discharged from the coolant discharge path is returned to the coolant supply path again after temperature of the discharged coolant has been adjusted.

An example of assembling the electrostatic chuck assembly 15 will be described below with reference to FIGS. 3A and 3B. First, the electrostatic chuck 20, the focus ring 50, and the O-rings 65 and 67 are prepared. Then, the small-diameter O-ring 65 is fitted into the inner peripheral groove 55 of the focus ring 50, and the large-diameter O-ring 67 is fitted into the outer peripheral groove 57. Thereafter, the focus ring 50 including the fitted O-rings 65 and 67 is placed on the F/R placement surface 28a of the electrostatic chuck 20. At that time, the focus ring 50 is placed such that the inner peripheral groove 55 and the outer peripheral groove 57 of the focus ring 50 and the small-diameter O-ring 65 and the large-diameter O-ring 67 fitted into those grooves 55 and 57 extend along the outer peripheral side and the inner peripheral side of the concave-convex region 29 formed in the F/R placement surface 28a, respectively. Thus, the concave-convex region 29 of the F/R placement surface 28a is kept in an airtight or almost airtight state by the O-rings 65 and 67 and the opposing region 54 of the focus ring 50.

A usage example of the electrostatic chuck assembly 15 will be described below with reference to FIG. 1. The wafer placement device 10 including the electrostatic chuck assembly 15 is used in a state fixed to a bottom surface of the chamber 80. A shower head 90 for releasing process gas toward the inside of the chamber 80 through many gas injection holes is arranged at a ceiling surface of the chamber 80.

The disk-shaped wafer W is placed on the wafer placement surface 22a of the electrostatic chuck 20. The wafer W is electrostatically attracted to the wafer placement surface 22a by the Coulomb force with application of the voltage to the wafer attraction electrode 32. Temperature of the wafer W can be controlled by adjusting temperature of the coolant that is supplied to the coolant path 72 in the cooling plate 70. At that time, He gas is supplied to between the wafer W and the concavities 23c of the wafer placement surface 22a for the purpose of increasing heat transfer. Temperature control of the wafer W is executed by detecting the temperature of the wafer with a not-illustrated temperature detection sensor and by performing feedback control such that the temperature of the wafer is held at a target temperature.

The annular focus ring 50 is placed on the F/R placement surface 28a of the electrostatic chuck 20. The focus ring 50 is electrostatically attracted to the F/R placement surface 28a by the Johnson-Rahbeck force with application of the voltage to the F/R attraction electrode 38. Temperature of the focus ring 50 can be controlled by adjusting temperature of the coolant that is supplied to the coolant path 72 in the cooling plate 70. At that time, He gas is supplied to between the focus ring 50 and the concavities 29c of the F/R placement surface 28a for the purpose of increasing heat transfer. Temperature control of the focus ring 50 is executed by detecting the temperature of the focus ring 50 with a not-illustrated temperature detection sensor and by performing feedback control such that the temperature of the focus ring is held at a target temperature.

In the above-mentioned state, the inside of the chamber 80 is evacuated and set to create a predetermined vacuum atmosphere (or decompressed atmosphere), and plasma is produced by supplying a radio-frequency power between the cooling plate 70 and the shower head 90 while the process gas is supplied from the shower head 90. Then, CVD film formation or etching is performed on the wafer by utilizing the plasma.

Although the focus ring 50 wears down as the wafer W is processed with the plasma, replacement of the focus ring 50 may be made after processing a plurality of wafers W because the focus ring 50 is fairly thick.

Here, correspondence relationship between components in this embodiment and components in the present invention is clarified. The ceramic body 22 in this embodiment corresponds to a ceramic body in the present invention. The wafer attraction electrode 32 corresponds to a first electrode, and the F/R attraction electrode 38 corresponds to a second electrode. Furthermore, the pair of O-rings 60 corresponds to a pair of elastic annular sealing members.

In use of the electrostatic chuck assembly 15 or the electrostatic chuck 20 according to the above-described first embodiment, the voltages are applied to the wafer attraction electrode 32 and the F/R attraction electrode 38 in the state in which the wafer W is placed on the wafer placement surface 22a. With the application of the voltages, the wafer W is attracted to the wafer placement surface 22a and the focus ring 50 is attracted to the F/R placement surface 28a. Because the focus ring 50 is thicker than the wafer W, it is hard to tightly attract the focus ring while correcting a warp of the focus ring. However, the O-rings 65 and 67 absorb the warp of the focus ring 50, and hence the focus ring 50 can be tightly attracted to the F/R placement surface 28a. As a result, the concave-convex region 29 of the F/R placement surface 28a is kept in an airtight or almost airtight state by the O-rings 65 and 67 and the focus ring 50, whereby the leakage of the gas supplied to the concave-convex region 29 can be suppressed. Thus, in the wafer placement device 10 including the above-described electrostatic chuck assembly 15 or electrostatic chuck 20, the focus ring 50 can be sufficiently cooled by utilizing the heat transfer with the gas supplied to the concave-convex region 29. In addition, since the wafer attraction electrode 32 and the F/R attraction electrode 38 are independent of each other, appropriate voltages can be applied to the individual electrodes.

Furthermore, in the electrostatic chuck assembly 15, since the pair of O-rings 60 is fitted into the annular grooves 55 and 57 formed in the focus ring 50, the O-rings 65 and 67 can be easily set in place with the aid of the grooves 55 and 57.

Moreover, in the electrostatic chuck assembly 15 or the electrostatic chuck 20, the first ceramic member 27 of the ceramic body is made of the material with the volume resistivity at the level capable of generating the Coulomb force, and the second ceramic member 28 is made of the material with the volume resistivity at the level capable of generating the Johnson-Rahbeck force. In use of the electrostatic chuck 20, therefore, the wafer W is attracted to the wafer placement surface 22a by the Coulomb force, and the focus ring 50 is attracted to the F/R placement surface 28a by the Johnson-Rahbeck force that is stronger than the Coulomb force. Because the Johnson-Rahbeck force provides stronger attraction force, the focus ring 50 can be attracted to the F/R placement surface 28a while the warp of the focus ring 50 is corrected.

In the electrostatic chuck assembly 15 or the electrostatic chuck 20, the volume resistivity of the first ceramic member 27 is not less than $1\times10^{15}$ Ωcm, and the volume resistivity of the second ceramic member 28 is not less than $1\times10^{8}$ Ωcm and not more than $1\times10^{13}$ Ωcm. Accordingly, the first ceramic member 27 is easier to generate the Coulomb force, and the second ceramic member 28 is easier to generate the Johnson-Rahbeck force.

In the electrostatic chuck assembly 15 or the electrostatic chuck 20, the second ceramic member 28 is made of a ceramic doped with the fourth group element of the periodic table, and such a ceramic is suitable for thermal spraying.

In the electrostatic chuck assembly 15 or the electrostatic chuck 20, since the variation in thickness of the second ceramic member 28 is not more than 0.5 mm, the second ceramic member 28 does not include a too thin portion, and hence dielectric breakdown is hard to occur. Moreover, since the second ceramic member 28 does not include a too thick portion, a time necessary for eliminating charges is relatively shortened.

In the electrostatic chuck assembly 15 or the electrostatic chuck 20, since the F/R attraction electrode 38 is a bipolar electrode, it is easier to perform, for example, a charge elimination process to prevent a problem that is often caused in an electrostatic chuck of Johnson-Rahbeck type, i.e., a trouble in detachment of the electrostatic chuck attributable to residual charges.

In the electrostatic chuck assembly 15 or the electrostatic chuck 20, since the second ceramic member 28 is a sprayed film, the second ceramic member 28 can be relatively easily formed. Furthermore, since a main component of the second ceramic member 28 is the same as that of the ceramic material of the first ceramic member 27, the thermal conductivity, the thermal expansion coefficient, etc. of the second ceramic member 28 can be made substantially equal to those of the first ceramic member 27.

The present invention is not limited to the above-described embodiments, and can be carried out by various modes as long as they belong to the technical scope of the invention.

Figure 4:
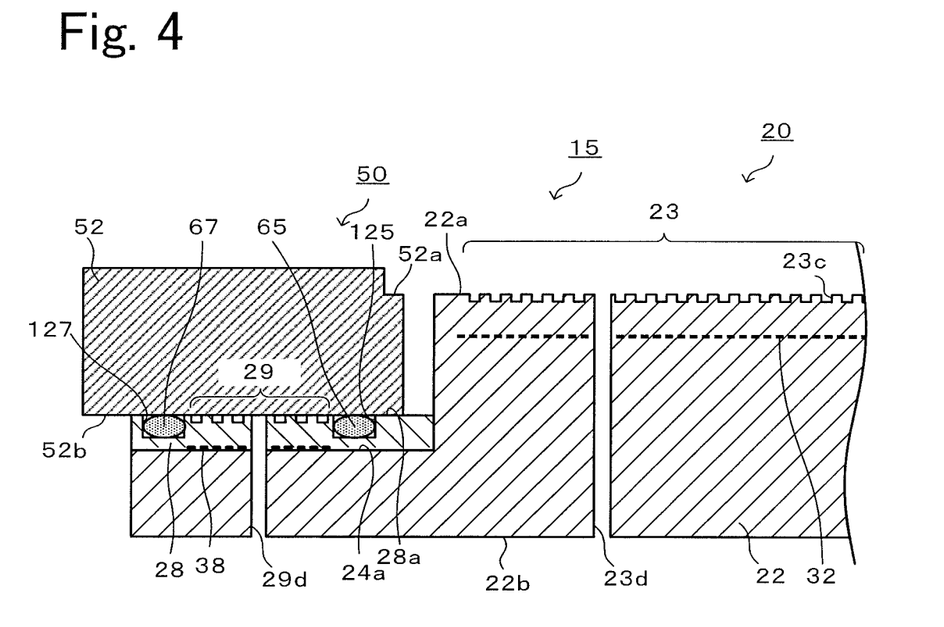
FIG. 4 is a partial enlarged view of another example of the electrostatic chuck assembly 15.
Figure 5:
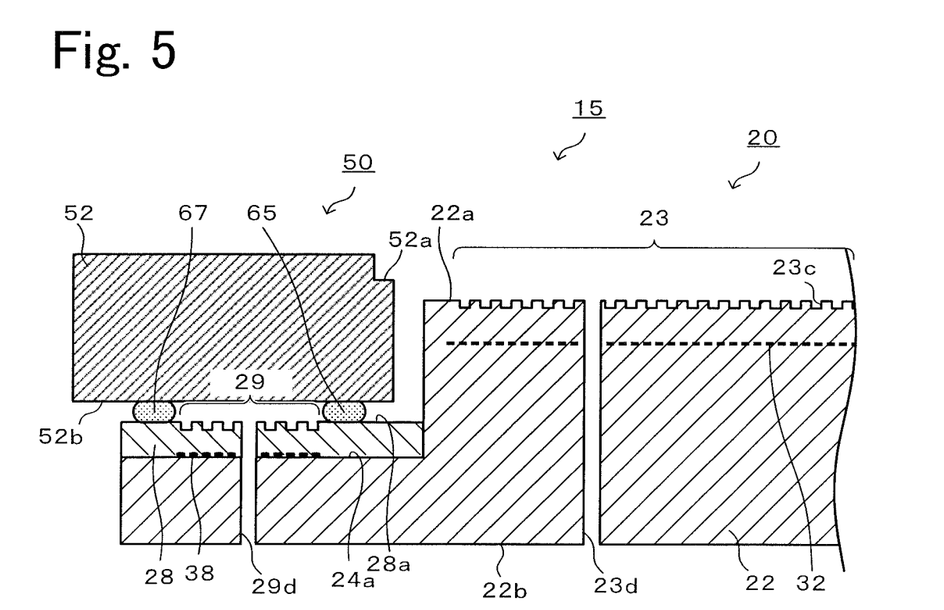
FIG. 5 is a partial enlarged view of still another example of the electrostatic chuck assembly 15.
Figure 6:
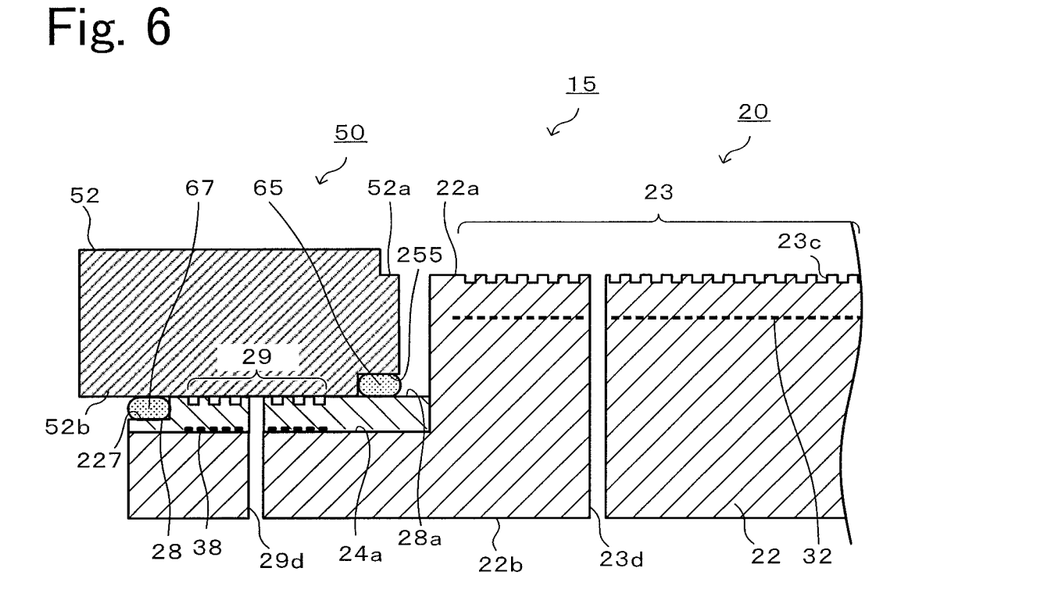
FIG. 6 is a partial enlarged view of still another example of the electrostatic chuck assembly 15.
Figure 7:
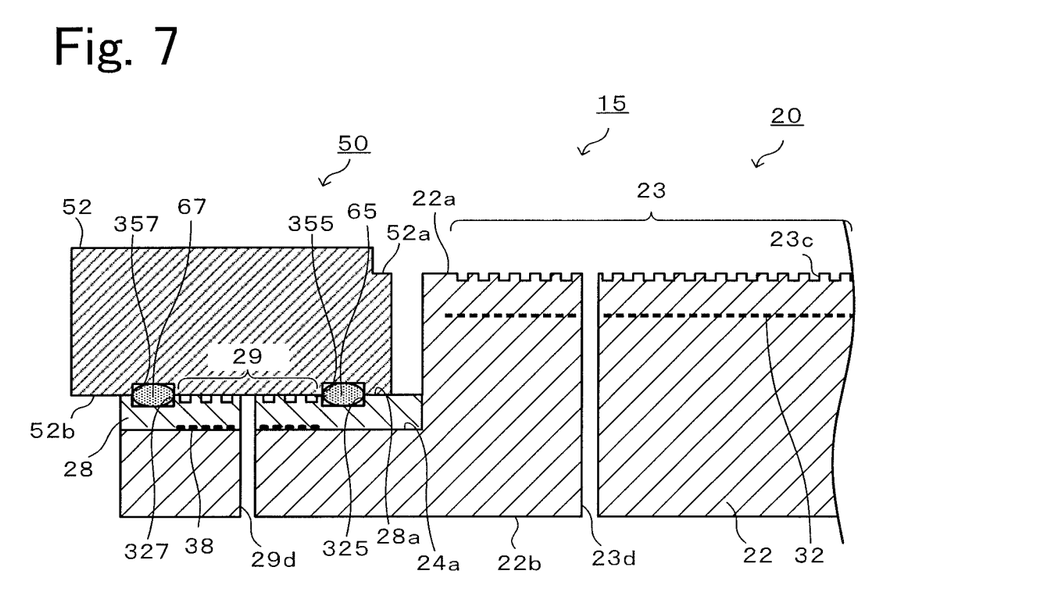
FIG. 7 is a partial enlarged view of still another example of the electrostatic chuck assembly 15.

For example, in the above-described embodiment, the small-diameter O-ring 65 and the large-diameter O-ring 67 are fitted respectively into the inner peripheral groove 55 and the outer peripheral groove 57 formed in the rear surface 52b of the focus ring 50. However, as illustrated in FIG. 4, the rear surface 52b of the focus ring 50 may be formed flat, and the small-diameter O-ring 65 and the large-diameter O-ring 67 may be fitted respectively into an inner peripheral groove 125 and an outer peripheral groove 127 formed in the F/R placement surface 28a. Alternatively, as illustrated in FIG. 5, the rear surface 52b of the focus ring 50 may be formed flat, a region of the F/R placement surface 28a other than the concave-convex region 29 may also be formed flat, and the small-diameter O-ring 65 and the large-diameter O-ring 67 may be sandwiched between the rear surface 52b of the focus ring 50 and the region of the F/R placement surface 28a other than the concave-convex region 29. Alternatively, as illustrated in FIG. 6, the small-diameter O-ring 65 may be arranged in a cutout groove 255 having an L-shaped cross-section and formed along an inner periphery of the rear surface 52b of the focus ring 50, and the large-diameter O-ring 67 may be arranged in a cutout groove 227 having an L-shaped cross-section and formed along an outer periphery of the F/R placement surface 28a. In FIG. 6, annular grooves each having a U-shaped cross-section, like the inner peripheral groove 55 in FIG. 2 and the outer peripheral groove 127 in FIG. 4, may be formed respectively instead of the cutout groove 255 and the cutout groove 227. Alternatively, as illustrated in FIG. 7, an inner peripheral groove 355 and an outer peripheral groove 357 each having a shallow depth may be formed in the rear surface 52b of the focus ring 50, and an inner peripheral groove 325 and an outer peripheral groove 327 each having a shallow depth may be further formed in the F/R placement surface 28a and positioned in a facing relation to the above-mentioned grooves 325 and 327, respectively. In addition, the small-diameter O-ring 65 may be fitted into both the inner peripheral grooves 355 and 325, and the large-diameter O-ring 67 may be fitted into both the outer peripheral grooves 357 and 327. In any case, as in the above-described embodiment, the gas supplied to between the F/R placement surface 28a and the focus ring 50 can be suppressed from leaking to the surroundings. In the case of FIG. 5, because the distance between the F/R placement surface 28a and the focus ring 50 increases, efficiency in cooling the focus ring 50 and the attraction force acting between the focus ring 50 and the F/R placement surface 28a tend to reduce in comparison with the above-described embodiment and modified embodiments. In the case of FIG. 7, positioning of the focus ring 50 is facilitated because of the structure that the inner peripheral grooves 355 and 325 and the outer peripheral grooves 357 and 327 are formed in both the focus ring 50 and the F/R placement surface 28a, that the small-diameter O-ring 65 is fitted into both the inner peripheral grooves 355 and 325, and that the large-diameter O-ring 67 is fitted into both the outer peripheral grooves 357 and 327.

While, in the above-described embodiment, the ceramic body 22 is constituted by the first ceramic member 27 and the second ceramic member 28, the ceramic body 22 may be formed as a one-piece member by using the material of the first ceramic member 27. In this case, the focus ring 50 is attracted to the F/R placement surface 28a by the Coulomb force.

While, in the above-described embodiment, the focus ring includes the annular recessed step surface 52a formed in the upper end portion of the ring main body 52, the annular recessed step surface 52a may be omitted. Furthermore, a skirt portion extending downward from the rear surface 52b of the ring main body 52 may be formed on the outer peripheral side of the focus ring.

While, in the above-described embodiment, the O-ring is used as the elastic annular sealing member, the elastic annular sealing member is not limited to particular one insofar as the sealing member has a low Young's modulus, and various types of packings, etc. can be optionally used. While the elastic annular sealing member has been described as being made of fluorine rubber, the elastic annular sealing member is just required to be made of an elastic material. Thus, the elastic annular sealing member may be made of, for example, a fluorine resin, a silicone resin, or silicone rubber. Moreover, the elastic annular sealing member may be bonded to the electrostatic chuck 20 and/or the focus ring 50.

While, in the above-described embodiment, a sprayed film is used as the second ceramic member 28, another type of coating film formed by using suitable one of other coating techniques, such as an aerosol deposition method, may also be used instead of the sprayed film. Because the thermal spraying and the other coating methods can control a thickness with relatively high accuracy, a coating film developing the desired attraction force can be easily obtained, and the obtained coating film is suitable for ensuring insulation. The thermal spraying may be carried out by using not only a general spray method, but also other various spray methods such as a cold spray method and a suspension plasma spray method.

While, in the above-described embodiment, the F/R attraction electrode 38 is a bipolar electrode, it may be a monopolar electrode. Furthermore, in the above-described embodiment, the wafer attraction electrode 32 may be a bipolar electrode or a monopolar electrode. The F/R attraction electrode 38 may be an electrode similar to the wafer attraction electrode 32.

In the above-described embodiment, a radio-frequency (RF) electrode and/or a heater electrode may be further embedded inside the ceramic body 22 and positioned in a facing relation to the wafer placement surface 22a. The RF electrode is formed of a conductive mesh and is disposed parallel to the wafer placement surface 22a. A rear surface of the RF electrode is connected to a not-illustrated power supply rod that is inserted from the rear surface 22b of the ceramic body 22. An RF voltage is applied to the RF electrode through the power supply rod. The heater electrode is a resistive heating element formed of a conductive coil or printed patter and is wired parallel to the wafer placement surface 22a over the entirety of a region in a facing relation to the wafer placement surface 22a in a one-stroke pattern from one end to the other end. The one end and the other end of the heater electrode are connected to a pair of power supply rods that is inserted from the rear surface 22b of the ceramic body 22. A voltage is applied to the heater electrode through the pair of power supply rods. Similarly, an RE electrode and/or a heater electrode may be embedded inside the ceramic body 22 and positioned in a facing relation to the F/R placement surface 28a.

In the above-described embodiment, the cooling plate 70 is bonded to the rear surface 22b of the electrostatic chuck 20 with the bonding sheet 75 interposed therebetween. However, when the cooling plate 70 is made of, for example, a ceramic composite material such as Si—SiC—Ti, the cooling plate 70 may be bonded to the rear surface 22b of the electrostatic chuck 20 by TCB (Thermal compression bonding). TCB implies the method of sandwiching a metal bonding material between two members to be bonded to each other, and press-bonding those two members under condition of heating them to temperature not higher than the solidus temperature of the metal bonding material.

The above-described embodiment may include a lift pin for raising and lowering the wafer W. In such a case, an insertion hole into which the lift pin is inserted may be formed to penetrate through the chamber 80, the cooling plate 70, the bonding sheet 75, and the electrostatic chuck 20.

While, in the above-described embodiment, the plasma is produced by supplying the radio-frequency power between the cooling plate 70 and the shower head 90, the plasma may be produced by supplying the radio-frequency power between an electrostatic electrode, such as the wafer attraction electrode 32 or the F/R attraction electrode 38, and the shower head 90. As an alternative, the RF electrode may be further disposed as described above, and the plasma may be produced by supplying the radio-frequency power between the RF electrode and the shower head 90.

What is claimed is:

1. An electrostatic chuck assembly comprising:
   a ceramic body having a wafer placement surface that is a circular surface, and a focus ring placement surface that is formed around the wafer placement surface and is positioned at a lower level than the wafer placement surface;
   a first electrode embedded inside the ceramic body and positioned in a facing relation to the wafer placement surface;
   a second electrode embedded inside the ceramic body and positioned in a facing relation to the focus ring placement surface;

a concave-convex region formed in the focus ring placement surface to hold gas;
a focus ring placed on the focus ring placement surface; and
a pair of elastic annular sealing members arranged between the focus ring placement surface and the focus ring on inner peripheral side and outer peripheral side of the focus ring placement surface, and surrounding the concave-convex region in a sandwiching relation;
wherein a main body of the ceramic body except for a portion between the focus ring placement surface and the second electrode is formed of a first ceramic member with a volume resistivity at a level generating a Coulomb force, and a sub-body of the ceramic body constituted by the portion between the focus ring placement surface and the second electrode is formed of a second ceramic member with a volume resistivity at a level generating a Johnson-Rahbeck force; and
wherein the volume resistivity of the first ceramic member is different from the volume resistivity of the second ceramic member.

2. The electrostatic chuck assembly according to claim 1, wherein the elastic annular sealing members are fitted into annular grooves formed in at least one of the focus ring placement surface and the focus ring.

3. An electrostatic chuck comprising:
a ceramic body having a wafer placement surface that is a circular surface, and a focus ring placement surface that is formed around the wafer placement surface and is positioned at a lower level than the wafer placement surface;
a first electrode embedded inside the ceramic body and positioned in a facing relation to the wafer placement surface;
a second electrode embedded inside the ceramic body and positioned in a facing relation to the focus ring placement surface;
a concave-convex region formed in the focus ring placement surface to hold gas; and
a pair of annular grooves formed on inner peripheral side and outer peripheral side of the focus ring placement surface, and surrounding the concave-convex region in a sandwiching relation;
wherein a main body of the ceramic body except for a portion between the focus ring placement surface and the second electrode is formed of a first ceramic member with a volume resistivity at a level generating a Coulomb force, and a sub-body of the ceramic body constituted by the portion between the focus ring placement surface and the second electrode is formed of a second ceramic member with a volume resistivity at a level generating a Johnson-Rahbeck force; and
wherein the volume resistivity of the first ceramic member is different from the volume resistivity of the second ceramic member.

* * * * *